United States Patent [19]

Kugan

[11] Patent Number: 5,128,173
[45] Date of Patent: Jul. 7, 1992

[54] PROCESS FOR DEPOSITION OF INORGANIC MATERIALS

[75] Inventor: S. Ananda Kugan, Boise, Id.

[73] Assignee: Micron Technology, Inc., Boise, Id.

[21] Appl. No.: 581,588

[22] Filed: Sep. 12, 1990

[51] Int. Cl.$^5$ .............................................. C23C 16/00
[52] U.S. Cl. .................................. 427/38; 427/248.1
[58] Field of Search ................................. 427/38, 248.1

[56] References Cited

U.S. PATENT DOCUMENTS 4,634,600 1/1987 Shimizu ................................. 427/38

OTHER PUBLICATIONS

"In-Situ Rapid Isothermal Processing (RIP) of Thin CaF2 Films on Silicon (100)" 1987 Authors: S. Anand Kugan, R. Radpout and R. Singh.
R. F. C. Farrow, et al, in the J. Vac. Sci. Technol., vol. 19 No. 3 Sep./Oct. 1981.
"MeV Ion Channeling Study of CaF2/Si (111) Epitaxy" in J. Vac Sci. Technol., A. vol. 4, No. 3, May/Jun. 1986.
"Epitaxial Dielectrics for Ultra-Large Sale Integration (ULSI) and Three-Dimensional IC's" by F. Radpour, S. Ananda Kugan, R. Singh, M. Rahmati, W. L. Krisa, S. K. Kahng, S. P. Joshi, J. Narayan, P. K. Chatterjee. (pp. 1-11) 1987.

Primary Examiner—Bernard Pianalto
Attorney, Agent, or Firm—Marger, Johnson, McCollom & Stolowitz, Inc.

[57] ABSTRACT

The subject invention comprises forming a plurality of positively charged ions of an ionizable coating material in an ion formation area. A deposition area is provided at a predetermined distance from the ion formation area. This deposition area is capable of being negatively charged for attracting the positively charged ions of the ionizable coating material. Next, the deposition area is negatively charged so that a uniform, substantially parallel flow path is formed for the ionizable coating material between the ion formation area and the negatively charged deposition area. A substrate is then positioned between the ion formation and deposition areas within the uniform, substantially parallel flow path, and preferably perpendicular to the flow path. The positively charged ions of the coating material are released from the ion formation area into the flow path, and are moved within the flow path by the attraction of the positively charged ions toward the negatively charged deposition area. This results in a uniform deposition of a thin layer of the coating material onto the surface of the substrate which faces the ion formation area within the ionized coating material flow path. The process of this invention can be controlled so that the formation of the positively charged ions is confined within the ion formation area and, when the formation of the positively charged ions is completed, the release of the positively charged ions is controlled so that it is conducted when the substrate is positioned.

28 Claims, 3 Drawing Sheets

PROCESS FOR DEPOSITION OF INORGANIC MATERIALS

BACKGROUND OF THE INVENTION

This invention relates to a process and to a system for the deposition of inorganic materials, and more particularly to the deposition of inorganic dielectric materials onto a semiconductor substrate.

The deposition of inorganic materials, particularly dielectric materials, onto elemental and compound semiconductor substrates has provoked considerable interest in recent years. In semiconductor device fabrication dielectric films have a wide variety of potential applications such as gates, isolation and passivation materials. This expanding technology requires new materials if future growth is to continue. Some current materials under particular investigation include alkaline earth fluorides such as calcium fluoride, barium fluoride, strontium fluoride, mixtures thereof, and the like. Alkaline earth fluorides are of particular interest because they are closely compatible individually or as mixtures with substrate materials typically used in the semiconductor industry such as silicon and the like. Another aspect of this technology relates to the adaptation of inorganic material deposition to a production environment so that substantially high throughputs can be achieved.

In a paper delivered in 1987 entitled, "In-Situ Rapid Isothermal Processing (RIP) of Thin CaF2 films on Silicon (100)" S. Ananda Kugan, et al. described the use of Group II-A fluorides to produce epitaxial dielectric films on silicon and compound semiconductors. In their process, epitaxial dielectric films were deposited in an E-beam system at room temperature and subsequently subjected to in-situ rapid isothermal annealing using incoherent light sources incorporated in the E-beam system. Electrical and structural properties of thin CaF2 films (100 to 1000 Angstroms) deposited on silicon (100) were presented.

The pioneering work on fluorides of barium, strontium, calcium and magnesium in a fluoride vaporization system was described in a paper by R. F. C. Farrow, et al. in the J. Vac. Sci. Technol., Volume 19, No. 3, Sep.-/Oct. 1981. The work described included condensation of BaF2 and CaF2 beams in ultraviolet light, onto room temperature surfaces of semiconductors, such as silicon and the like, to produce stoichiometric, polycrystalline, fluorite structure films with little or no preferred orientation.

Another article directed to Group IIA, Fluoride Semiconductor Systems, entitled "MeV Ion Channeling Study of Caf2/Si(111) Epitaxy" in J. Vac. Sci. Technol., A, Volume 4, No. 3, May/Jun. 1986, describes deposition using high-energy electron beam technology. The article states that it is well known for calcium fluoride to be damaged by exposure to high energy E-beams. In fact, it is commonly observed that the normally transparent calcium fluoride layers are colored after exposure to the electron beam due to the formation of color centers.

Finally, an article entitled, "Epitaxial Dielectrics for Ultra-Large Scale Integration (ULSI) and Three-Dimensional IC's" by F. Radpour, et al., at the First International Symposium on ULSI held in May of 1987, describes the development of a reduced thermal budget processing technique for the deposition of epitaxial dielectric films on silicon and compound semiconductors was described. This new technique comprises room temperature deposition of epitaxial dielectrics followed by in-situ rapid isothermal annealing. Calcium fluoride films on silicon substrates were studied. The electron beam system was modified to include a rapid isothermal processor. The processor essentially consisted of high-intensity tungsten-halogen lamps housed in a vacuum deposition chamber.

Although inorganic films have been deposited onto silicon wafers and compound semiconductors, the deposition of the inorganic material has in general not been uniform. The results and experimental apparatus and methods used thus far are not suited to the fabrication of semiconductor products on a production basis.

Therefore, a need exists for a deposition process and apparatus which will uniformly deposit inorganic dielectric materials, particularly materials such as alkaline earth fluorides, onto semiconductor substrates, particularly on an efficient and effective production basis.

SUMMARY OF THE INVENTION

The present invention satisfies the above existing needs, and relates to uniformly deposit inorganic dielectric materials, particularly materials such as alkaline earth fluorides, onto substances, including silicon or other compound semiconductor devices. This enables deposition of inorganic materials onto semiconductor substrates on an efficient and effective production basis.

The subject invention comprises forming a plurality of positively charged ions of an ionizable coating material in an ion formation area. A deposition area is provided at a predetermined distance from the ion formation area. This deposition area is capable of being negatively charged for attracting the positively charged ions of the ionizable coating material. Next, the deposition area is negatively charged so that a uniform, substantially parallel flow path is formed for the ionizable coating material between the ion formation area and the negatively charged deposition area. A substrate is then positioned between the ion formation and deposition areas within the uniform, substantially parallel flow path, and preferably perpendicular to the flow path. The positively charged ions of the coating material are released from the ion formation area into the flow path, and are moved within the flow path by the attraction of the positively charged ions toward the negatively charged deposition area. This results in a uniform deposition of a thin layer of the coating material onto the surface of the substrate which faces the ion formation area within the ionized coating material flow path. The process of this invention can be controlled so that the formation of the positively charged ions is confined within the ion formation area and, when the formation of the positively charged ions is completed, the release of the positively charged ions is controlled so that it is conducted when the substrate is positioned.

The ionizable coating material can be particularized by vaporizing the ionizable coating material using E-beam, or by heating or melting the ionizable coating material. The ionizable coating material itself is preferably an inorganic dielectric material. It can also be a halogenated alkaline earth metal, preferably a fluorinated alkaline earth metal, and more preferably a fluorinated alkaline earth metal selected from the group consisting of CaF2, BaF2, SrF2, or mixtures thereof. Regarding the substrate itself, it is typically a semiconductor material, preferably silicon or a silicon compound, GaAs, or InP. The thin film coating can be controlled so that it is deposited in a thickness of up to about 1000 angstroms, and as little as 250 angstroms without pinholes.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
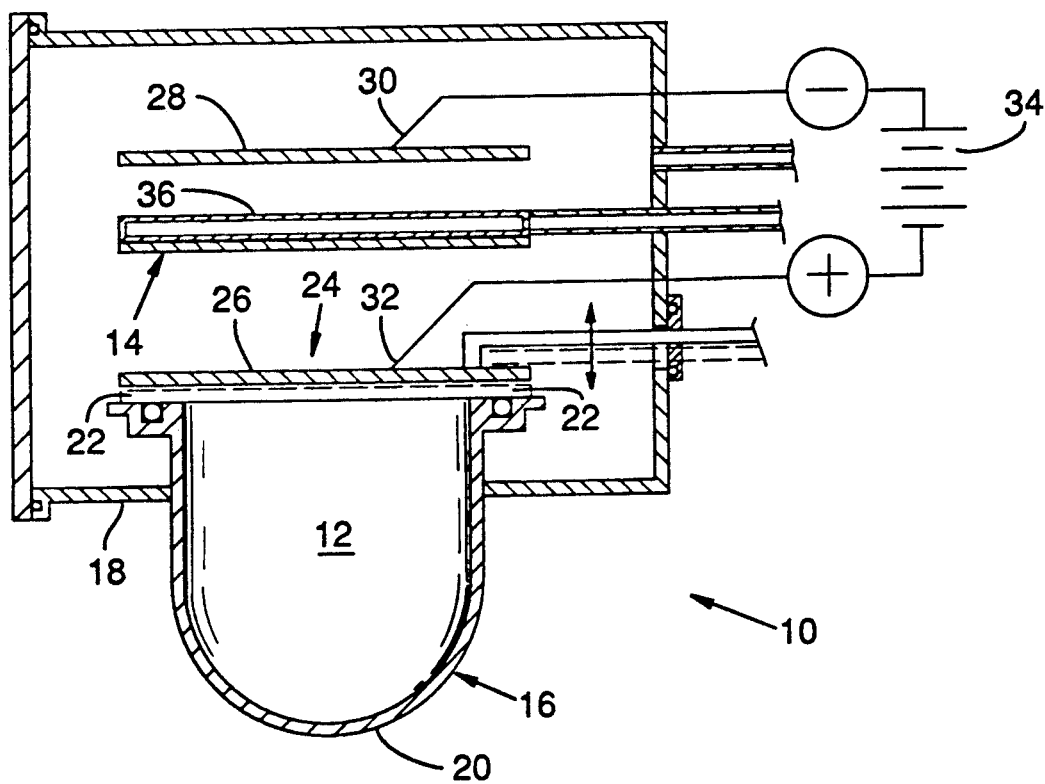
FIG. 1 is a schematic representation of a preferred design of a deposition system of the present invention, including a vacuum deposition chamber 18 for uniform deposition of an inorganic material onto a single substrate, in this case a silicon wafer.

Referring now to FIG. 1, a preferred design of a deposition system 10 of the present invention is depicted for the uniform deposition of an ionizable coating material 12, particularly an inorganic material, onto the downward facing surface of a substrate 14, in this case a silicon wafer. A source charge cell 16 is located at the bottom of a vacuum deposition chamber 18. The cell 16 defines a hollow central container 20 and an opening 22 at its top, and includes a heating device (not shown) which can generate sufficient heat to vaporize the coating material 12 and form a gas phase ionized coating product. Material 12 can be introduced into the confines of the container 20 through the opening 22. When the material 12 is heated or melted to form an ionized coating material, in the gas phase, ions will flow upward out of the cell 16 through opening 22 for coating substrate 14.

A shutter mechanism 24 is provided to cover the opening 22 before the deposition process begins, and particularly during the heating or melting of the coating material to form the ionized coating material. In this way, when chamber 18 is initially degassed, microparticulate material is prevented from escaping from the cell 16. This avoids partial deposition onto the substrate 14 prior to complete formation of ionized coating material. The shutter system 24 includes a metal cover plate 26 which is moved between respective open and closed positions by a synchronous shutter mechanism (not shown). In the closed position, the plate 26 is positioned by the shutter mechanism so that it rests on top of the cell 16 and covers the opening 22, thereby retaining the coating material 12 within the central area 20. In the open position, the shutter cover plate 26 is moved by the shutter mechanism from atop the cell 16 so that opening 22 is uncovered, allowing the ionized coating material to flow upward out of the container 20.

At the top of the deposition chamber 18, and in substantial vertical alignment with metal cover plate 26, is located a second metal plate 28, which together with metal cover plate 26 acts as a parallel-plate capacitor. Plates 26 and 28 include connectors 30 and 32, respectively, which attach to a D.C. voltage source 34. The voltage source 34, which is typically about 10 to 20 volts D.C. so that plate 26 becomes positively charged and plate 28 becomes negatively charged. The gaseous coating material 12 within the confines of cell 16 is then positively charged to form a plurality of positively charged ions of that material.

The substrate 14 is located between the respective plates 26 and 28 during the coating operation. A wafer holder 36, such as a graphite disc, is provided for holding the substrate 14 in position between plates 26 and 28 with the substrate surface to be coated facing downward toward the top of the charge cell. The gap between plate 28 and substrate 14 should be narrow, preferably at a distance of about 1-2 mm. The gap between the substrate surface and the top of the charge cell 16 should be sufficient to enable the electric field between plates 26, 28 to parallelize the positive ion flux rising toward the substrate 14; e.g. about 10-15 mm.

In use, plate 28 is positioned immediately above substrate 14 which has been uniformly negatively charged to form a negatively charged deposition area. The material 12 in the closed cell 16 has been vaporized and positively charged to form a closed deposition source of positively charged ions of the coating material. Since plate 26 is in the closed position during the heating and ionization operations, and is positively charged to repel ions downward into the container, substantially all of the ionized coating material is retained within the confines of the source cell.

When the cover plate 26 of the closed deposition source is moved to an open position, the positively charged ions are released from within cell 16. A uniform, substantially parallel flow path has been created by the electric field between the positively charged deposition source and the negatively charged deposition area, respectively. Therefore, the positively charged ions flow upward in a uniform flow path due to attraction thereof toward the uniformly negatively charged deposition area. However, since the substrate is located between the source cell 16 and the plate 28, the uniform flow of ionized coating material will be uniformly deposited as a thin layer onto said substrate 14.

Electronic control devices (not shown) can be provided to detect when an optimum vaporization rate is reached in the charge cell and the cover plate 26 can be opened, such as a thickness monitor attached to plate 26, as well as when deposition of the coating material onto the substrate 14 is complete and the cover plate 26 can be closed, such as a thickness monitor associated with substrate 14. After the coating operation is completed, the coated substrate is removed from the system 10.

Figure 2:
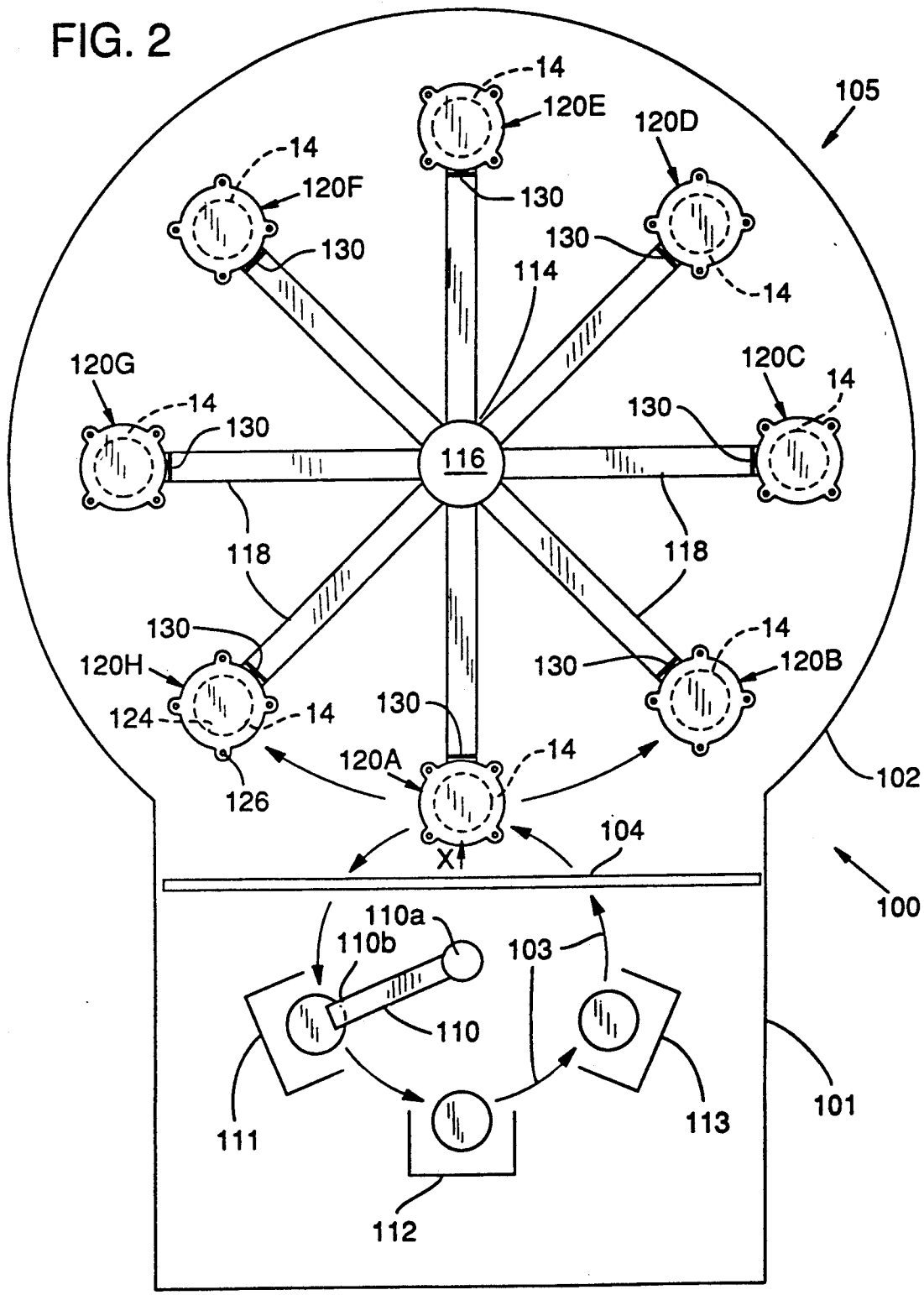
FIG. 2 is a schematic representation of a system for the deposition of inorganic material onto a plurality of substrates which are held by disk-shaped members 120A-H during the deposition by a plurality of deposition chambers, such as those depicted in FIG. 1.

FIG. 2 shows a system 100 for depositing a thin layer of material onto a plurality of substrates 14. The deposition technology employed in system 100 is similar to that which is generally depicted in FIG. 1, except that, as depicted, it can produce eight coated substrates in a single deposition run instead of one.

The system 100 comprises a load lock device 101 and a vapor deposition chamber 102. Load lock device 101 includes a series of cassettes 111, 112 and 113 for storing the substrates prior to use in the deposition operation and for feeding the substrates to vapor deposition chamber 102. The feeding operation is conducted thru the use of a robotic arm 110 which is connected at one end so that it pivots about pivot point 110a. The free end 110b of robotic arm 110 moves thru an accurate path as defined by directional arrows 103 for transferring the wafers via the robotic arm 110 to the deposition chamber section 102.

A door 104 is located between the load lock device 101 and the vapor deposition chamber 102, respectively. In the closed position, door 104 provides a physical separation between load lock device 101 and the vapor deposition chamber 102, respectively. In the open position, substrates 14 can be transferred from the load lock device 10; to the vapor deposition chamber 102.

Deposition chamber 102 includes therewith a carousel-type system 105 for uniformly depositing a thin film of the type previously described onto a plurality of substrates. The system 105 includes a cylindrically-shaped spindle 114 having a vertically-extending central axis 116. Spindle 114 is rotatable in a 360 degree path of rotation about the central axis 116. Attached to the spindle 114 is a series of eight substantially evenly spaced (at substantially 45 degree intervals) horizontally-extending radial support arms 118 each having a horizontally-extending central axis. The arms 118 extend outwardly from the spindle 114 at substantially the same vertical height. A computer controlled stepper motor (not shown) is adapted to raise, rotate, and lower the spindle 114. Corresponding to each of these 8 spindle positions are 8 source charge cells 10 of the single-use type described above (see FIG. 1) that hold the charged material 12.

Figure 3:
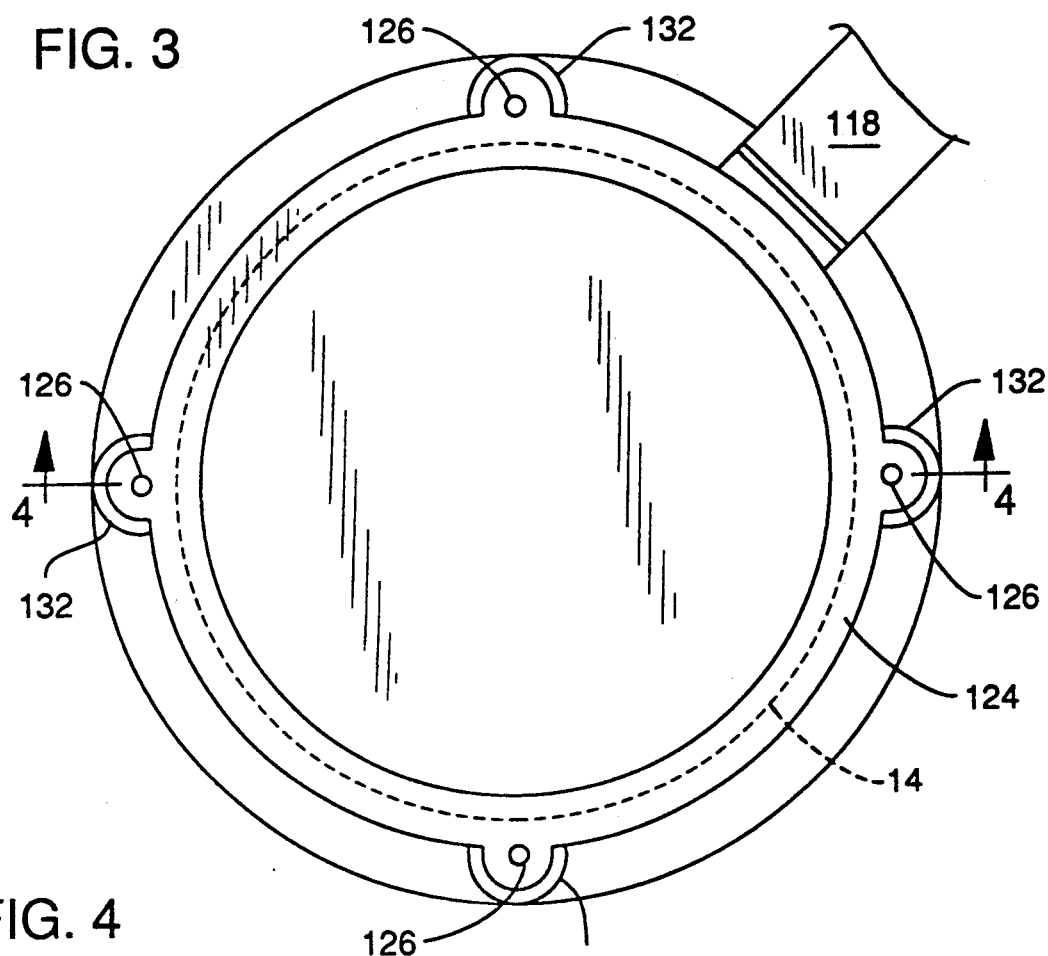
FIG. 3 is an enlarged plan view of underside of the disk-shaped members 120A-H of FIG. 2.
Figure 4:
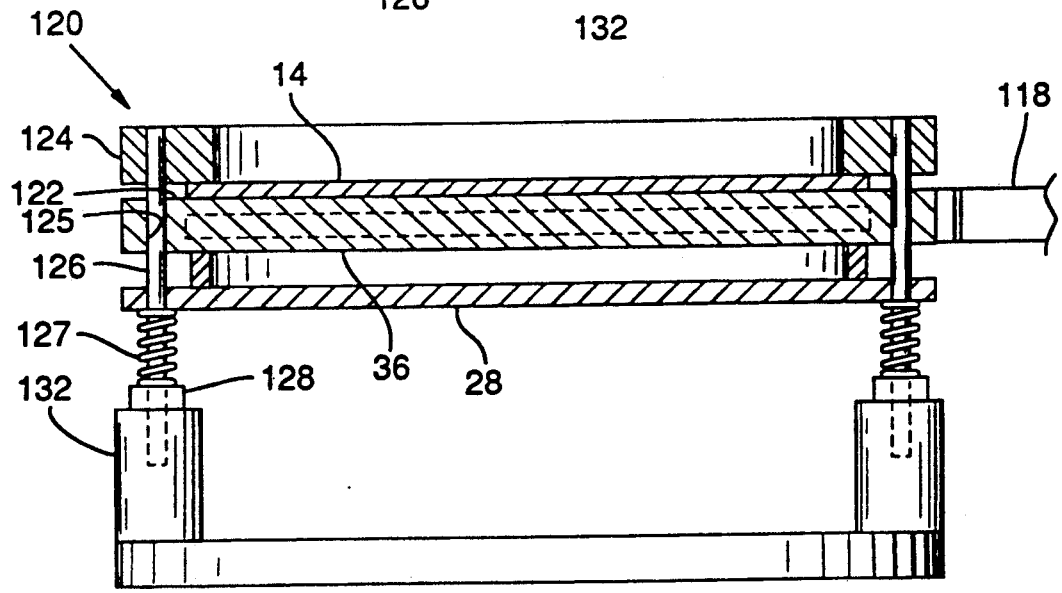
FIG. 4 is a sectional view taken along line 4—4 of FIG. 3.

Eight disk-shaped members 120 are provided to serve as wafer holders. As shown in FIGS. 3 and 4, each disk-shaped member 120 is rotatably connected at point 130 on its periphery to the free end of one of arms 118 for 180 degree rotation about the longitudinal axis of arm 118. Member 120 comprises round flat surface 122 and circular clamping ring 124. Pins 126 extend from clamping ring 124 and pass through holes 125 in surface 122. Pins 126 are fitted with springs 127 and spring retainers 128 which urge clamping ring 124 towards surface 122. The substrates 14 are held between flat surface 122 and clamping ring 124 during the thin film deposition operation.

Clamping ring lifters 132 raise clamping ring 124 from surface 122 for inserting and removing substrates 14. Lifters 132 are spaced to engage pins 126 when member 120 is rotated into position for receiving a substrate 14. Lifters 132 vertically extend to engage pins 126 and lift clamping ring 124 away from surface 122 for insertion or removal of substrate 14 to or from member 120.

The deposition chamber is vacuum controlled, and is pumped down to create a vacuum of about $10^{-6}$ torr. or less. Heating is also available because different types of thin film deposition need different substrate temperatures. Above each of the 8 deposition stations are 8 heating lamps (not shown).

In use, substrates 14 are placed in the load lock device 101. Cassettes 111, 112 and 113 are three locations which have known wafer boat holding features. Once the substrates are placed in the load lock device, it is closed and pumped down using a vacuum system to approximately $10^{-3}$ torr. Then the door 104 is opened in between deposition chamber and load lock device 101. Now, substrates 14 in the cassettes 111-113 (substrate boats) are picked up by the robotic arm 110 and then placed on each of the disk-shaped members 120 one by one. With member 120A at position X, lifters 132 are extended, and clamping ring 124 is raised away from surface 122. Substrate 14 is placed on surface 122 of member 120A, and lifters 132 retract, clamping substrate 14 in place. Then the spindle 114 rotates 45 degrees so that member 120B is at a position "X" close to door 104. The next substrate 14 is then moved onto member 120B by robotic arm 110. This procedure continues until all 8 substrates are loaded on each of the 8 disk-shaped members. Then, door 104 is closed.

The deposition chamber is pumped down to create a vacuum at about $10^{-6}$ torr. Once the deposition chamber reaches the required vacuum, spindle 114 is raised up by the stepper motor and members 120A-120H are rotated 180 degrees so that the substrates 14 face downwards, i.e., facing the deposition source. Then the spindle 114 drops to its initial lowered position. The substrates 14 should be at an optimum distance (e.g. 50-150 mm) from the opening 20 of the source cells 16. If the optimum distance is small, the rotation of the member 120 may not be possible without raising the spindle up. Arms 118 are made of particle-free material that does not outgas at or above $10^{-6}$ torr vacuum. Electrical connection to the stage heater can be done through the arm 118.

Source cells 16 under each member 120 have been described above. The shutter system 24 has a thickness monitor or evaporation sensors. When ready to deposit, all the cells are heated to melt and evaporate the material 12. The sensors attached to the cover plate 26 sense the uniform evaporation. A control unit is programmed to control the opening and closing of the cover plate 26 with respect to opening 20 so that when all the sensors are synchronized, plate 26 will open. Heaters to the cells are controlled according to the desired deposition rate. Meantime, the members 120 are heated by the overhead heaters until they reach the pre-set temperature.

Now deposition takes place. Deposition can be done in either a single step or multi-step mode. If the single step process is employed, the time required for each such deposition is set. Once this is done, the cover plate is closed over and the source cell heater is turned off. The heater for the substrates is also shuts off, and the substrate allowed to cools down. Then the substrate is down loaded in the same manner which it is loaded.

In multi-step deposition we set the deposition rate and deposition time are set at each station. Once each station deposition is over, the shutter mechanism is closed, and the spindle 114 rotates to the next station. By this way, if there is any system dependence it will be shared equally in all substrates. Once the deposition phase is over, substrates are down loaded. Considering the demonstrated multistep deposited/grown high quality of these materials, this process is set up for multi-step processing of these materials.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A process for the uniform deposition of a thin layer of a ionizable coating material onto a substrate, which comprises providing a source for said uniform deposition, said deposition source having an open position and a closed position, respectively;

introducing said ionizable coating material into said deposition source;

maintaining said deposition source in a closed position;

particularizing and positively charging said ionizable coating material within said closed deposition source to form a plurality of positively charged ions of said ionizable coating material therewithin;

providing a negatively charged deposition area for attracting said positively charged ions of said ionizable coating material, said negatively charged deposition area being located at a distance from said deposition source;

positioning a substrate in a uniform, substantially parallel flow path of said ionizable coating material, between said closed deposition source and said negatively charged deposition area, respectively;

opening said closed deposition source and releasing said positively charged ions of said ionized coating material;

moving said positively charged ions of said ionized coating material in said flow path by attraction of said ions toward said negatively charged deposition area;

uniformly depositing a thin layer of said ionizable coating material onto said substrate;

closing said deposition source; and removing said coated substrate from between said deposition source and said negatively charged deposition area.

2. The process of claim 1, which further includes the step of negatively charging said deposition area, prior to releasing said positively charged ions, and thereby forming said flow path for said coating material between said ion formation area and said negatively charged deposition area.

3. The process of claim 1, wherein said positively charged ions move between said ion formation area and said negatively charged deposition area uniform, respectively, in a substantially parallel flow path.

4. The process of claim 1, wherein said positively charged ions move between said ion formation area and said negatively charged deposition area uniform, respectively, in an substantially upwardly directed, parallel flow path.

5. The process of claim 1, wherein said ionizable coating material is particularized by vaporizing said ionizable coating material.

6. The process of claim 1, wherein said ionizable coating material is particularized by heating or melting said ionizable coating material.

7. The process of claim 1, wherein said ionizable coating material is an inorganic material.

8. The process of claim 7, wherein said inorganic material is a dielectric material.

9. The process of claim 7, wherein said inorganic material is an halogenated alkaline earth metal.

10. The process of claim 9, wherein said halogenated alkaline earth metal is a fluorinated alkaline earth metal.

11. The process of claim 10, wherein said fluorinated alkaline earth metal is selected from the group consisting of $CaF_2$, $BaF_2$, $SrF_2$, or mixtures thereof.

12. The process of claim 1, wherein said substrate comprises a semiconductor.

13. The process of claim 1, wherein the formation of said positively charged ions is controlled so that it is conducted within the confines of said ion formation area and, when said formation of said positively charged ions is completed, the release of said positively charged ions is controlled so that it is conducted when said substrate is positioned.

14. The process of claim 1, wherein said thin film comprises a thickness of up to about 1000 angstroms.

15. A process for the uniform deposition of a thin layer of an ionizable coating material onto a substrate, which comprises providing a source for said uniform deposition, said deposition source having an open position and a closed position, respectively, and including a source cell defining a passageway, said source cell including means for opening and closing said passageway, said source cell in the closed position restraining said ionized coating material located therewithin, and said source cell in the open position releasing said ionized coating material located therewithin;

introducing said ionizable coating material into said deposition source;

maintaining said deposition source in a closed position;

particularizing and positively charging said ionizable coating material within said closed deposition source to form a plurality of positively charged ions of said ionizable coating material therewithin;

positioning a substrate in a uniform, substantially parallel flow path of said ionizable coating material, between said closed deposition source and negatively charged deposition area, respectively;

opening said closed deposition source and releasing said positively charged ions of said ionized coating material;

moving said positively charged ions of said ionized coating material in said flow path by attraction of said ions toward said negatively charged deposition area;

uniformly depositing a thin layer of said ionizable coating material onto said substrate;

closing said deposition source; and removing said coated substrate from between said deposition source and said negatively charged deposition area.

16. The process of claim 15, which further includes the step of negatively charging said deposition area, prior to releasing said positively charged ions, and thereby forming said flow path for said coating material between said ion formation area and said negatively charged deposition area.

17. The process of claim 15, wherein said positively charged ions move between said ion formation area and said negatively charged deposition area uniform, respectively, in a substantially parallel flow path.

18. The process of claim 15, wherein said positively charged ions move between said ion formation area and said negatively charged deposition area uniform, respectively, in an substantially upwardly directed, parallel flow path.

19. The process of claim 15, wherein said ionizable coating material is particularized by vaporizing said ionizable coating material.

20. The process of claim 15, wherein said ionizable coating material is particularized by heating or melting said ionizable coating material.

21. The process of claim 15, wherein said ionizable coating material is an inorganic material.

22. The process of claim 21, wherein said inorganic material is a dielectric material.

23. The process of claim 21, wherein said inorganic material is an halogenated alkaline earth metal.

24. The process of claim 23, wherein said halogenated alkaline earth metal is a fluorinated alkaline earth metal.

25. The process of claim 24, wherein said fluorinated alkaline earth metal is selected from the group consisting of $CaF_2$, $BaF_2$, $SrF_2$, or mixtures thereof.

26. The process of claim 15, wherein said substrate comprises a semiconductor.

27. The process of claim 15, wherein the formation of said positively charged ions is controlled so that it is conducted within the confines of said ion formation area and, when said formation of said positively charged ions is completed, the release of said positively charged ions is controlled so that it is conducted when said substrate is positioned.

28. The process of claim 15, wherein said thin film comprises a thickness of up to about 1000 angstroms.

* * * * *